(12) United States Patent
Lo

(10) Patent No.: US 6,775,135 B2
(45) Date of Patent: Aug. 10, 2004

(54) HEAT ISOLATION APPARATUS

(75) Inventor: Li-Chun Lo, Taipei (TW)

(73) Assignee: Quanta Computer Inc., Taoyuan Shien (TW)

( * ) Notice: Subject to any disclaimer, the term of this patent is extended or adjusted under 35 U.S.C. 154(b) by 0 days.

(21) Appl. No.: 10/347,587

(22) Filed: Jan. 22, 2003

(65) Prior Publication Data

US 2004/0085730 A1 May 6, 2004

(30) Foreign Application Priority Data

Nov. 1, 2002 (TW) .................................. 91217604 U

(51) Int. Cl.[7] .............................................. H05K 7/20
(52) U.S. Cl. .................... 361/687; 361/695; 361/690
(58) Field of Search ............................. 361/687–690, 361/693, 694, 695; 165/80.3, 185; 257/712, 721

(56) References Cited

U.S. PATENT DOCUMENTS

| | | | | |
|---|---|---|---|---|
| 5,440,450 A | * | 8/1995 | Lau et al. | ................... 361/695 |
| 6,094,347 A | * | 7/2000 | Bhatia | ......................... 361/695 |
| 6,243,261 B1 | * | 6/2001 | Janik et al. | .................. 361/687 |
| 2002/0179286 A1 | * | 12/2002 | Stener | |
| 2003/0027772 A1 | * | 2/2003 | Katsui | |
| 2003/0067745 A1 | * | 4/2003 | Patel | |

FOREIGN PATENT DOCUMENTS

TW 484722 4/2002

* cited by examiner

*Primary Examiner*—Anatoly Vortman
(74) *Attorney, Agent, or Firm*—Rabin & Berdo, P.C.

(57) ABSTRACT

A heat isolation apparatus is described. The heat isolation apparatus prevents an equipment surface from being heated to a high temperature by a heat source. The apparatus is especially employed for the heat source, such as an integrated circuit, in a notebook computer. The heat isolation apparatus comprises an inlet, an isolation wall, and an outlet. The inlet sucks in fresh air. The isolation wall formed by hollow structure delivers the fresh air to the outlet. The isolation wall separates the heat generated by the heat source on one side and reduces the temperature on the other side thereof. The heat isolation apparatus further connects with a fan. One end, near the fan, of the heat isolation apparatus further has a smooth, curves shape to smooth the floating fresh air.

12 Claims, 2 Drawing Sheets

HEAT ISOLATION APPARATUS

FIELD OF THE INVENTION

The present invention relates to a heat isolation apparatus and especially to a heat isolation apparatus for reducing a surface temperature of a notebook computer.

BACKGROUND OF THE INVENTION

Information technology and the computer industry are highly developed now. Portable electronic devices, such as a notebook computer, are widely used. Due to weight and practical requirements, portable devices tend to be lighter, thinner, shorter and smaller. The notebook computer is a particularly popular product because a notebook computer with a powerful calculation capability can deal with a great amount of digital data.

Semiconductor manufacture process has highly progressed. The current design of the semiconductor is becoming more complicated and more sophisticated due to functional requirements thereof. For example, the electric circuit layout of the central processing unit (CPU) is more complicated because the CPU has to provide more powerful functions for users and application software than before. The new generation CPU provides powerful functions and performance but also generates some new problem in use. One of the serious problems is that the new generation CPU with a complicated circuit consumes more power and thus severely elevates the temperature of the chips.

In general, a higher chip working temperature causes a higher surface temperature on the covers of the working equipment, and especially a portable device, such as the notebook computer. Normally, a notebook computer is located on a table or on the lap of a user when the notebook computer being used. Therefore, the surface temperature of the bottom cover directly influences the nerves of the user's lap. When the temperature is too high, the user feels uncomfortable; more seriously, the user may be hurt by the high temperature.

SUMMARY OF THE INVENTION

One object of the present invention is to provide a heat isolation apparatus which efficiently separates a heat source and a product cover for reducing the surface temperature thereof.

Another object of the present invention is to provide a heat isolation apparatus which sucks fresh air from outside of the product to separate the heat source and the product cover efficiently.

The present invention provides a heat isolation apparatus to avoid heat generated by a heat source of an electric appliance transferred to the cover surface of the electric appliance, and especially for stopping the heat generated by a integrated circuit of a notebook computer. The heat isolation apparatus includes an inlet, an isolation wall, and an outlet. The inlet sucks in cool air, and the isolation wall connecting with the inlet stops the heat generated by the heat source. The outlet connects with the isolation wall and exhausts the air out of the heat isolation apparatus.

The outlet of the heat isolation apparatus further couples with an inlet of a fan and the air enters the inlet of the fan via the outlet of the heat isolation apparatus. The outlet of the heat isolation apparatus further is curved in shape to enhance the air entering the fan more smoothly.

Conversely, the inlet of the heat isolation apparatus may couple with an outlet of a fan and the cool air enters the inlet of the heat isolation apparatus via the outlet of the fan. Besides, the inlet of the heat isolation apparatus further comprises a smooth curve shape to enhance smoother exhausting of the air from the fan.

The heat isolation apparatus can be manufactured by a plastic injection method, a sheet material forming method, or an extrusion forming method to produce a hollow shape thereof. Therefore, the heat isolation apparatus can reduce the surface temperature of the electric appliance and avoid the heat distribution to provide a safer working environment.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1A:
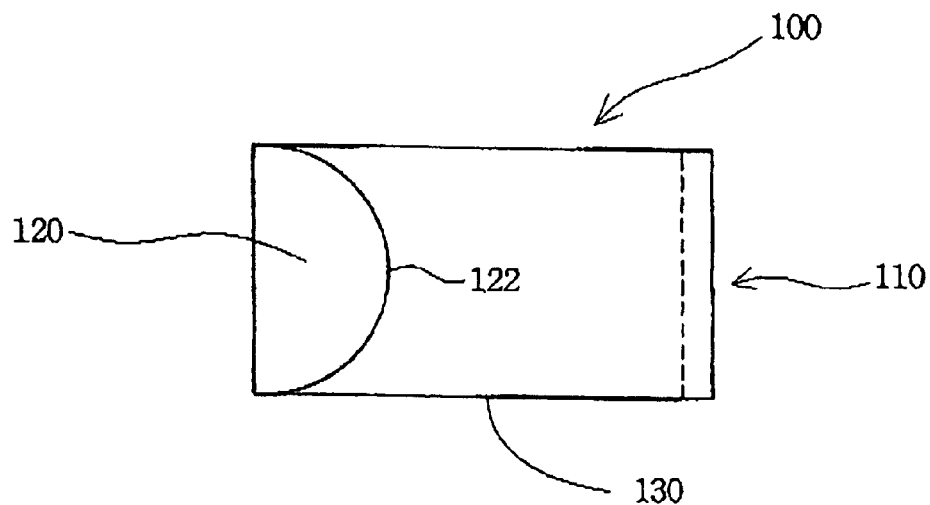
FIG. 1A is a schematic top view of a preferred embodiment of the heat isolation apparatus according to the present invention.
Figure 1B:
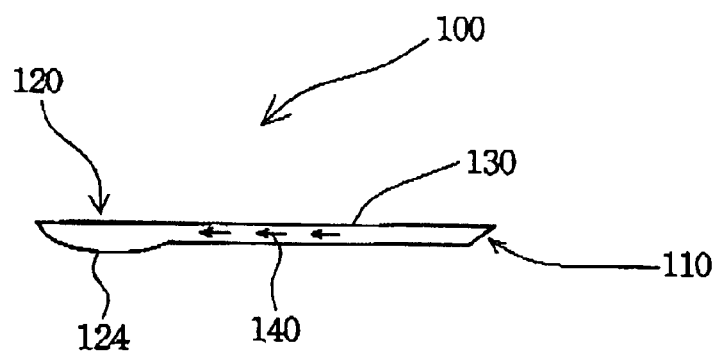
FIG. 1B is a schematic side view of FIG. 1A.

Referring to FIGS. 1A and 1B, FIG. 1A is a schematic top view of a preferred embodiment of the heat isolation apparatus according to the present invention, and FIG. 1B is a schematic side view of FIG. 1A. The heat isolation apparatus 100 includes an inlet 110, an outlet 120, and an isolation wall 130. In general, the heat isolation apparatus 100 has a hollow shape. For example, the heat isolation apparatus can utilize a plastic injection to form the shape thereof. The inlet 110 sucks in fresh air from outside and the fresh air transfers to the outlet 120 by way of isolation wall 130. Arrow 140 indicates the airflow direction inside the heat isolation apparatus 100. Nevertheless, the airflow of the heat isolation apparatus according to the present invention is not limited to the direction of arrow 140 inside the heat isolation apparatus 100; the heat isolation apparatus 100 can deliver the air in an inverse direction of arrow 140 inside the heat isolation apparatus 100. Further, the forming method of the heat isolation apparatus 100 is not limited to plastic injection, and the hollow shape of the heat isolation apparatus 100 can be formed by a sheet material forming method or an extrusion forming method.

Figure 2A:
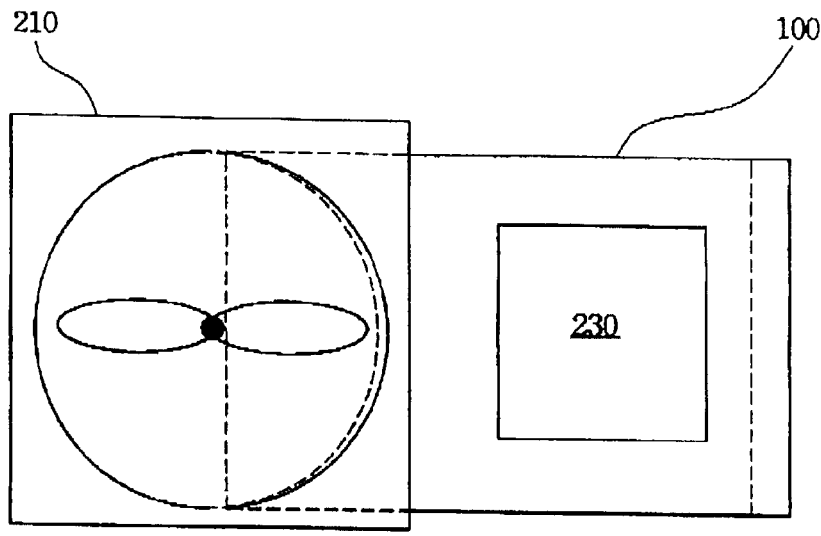
FIG. 2A is a schematic top view of the preferred embodiment assembled in a notebook computer.
Figure 2B:
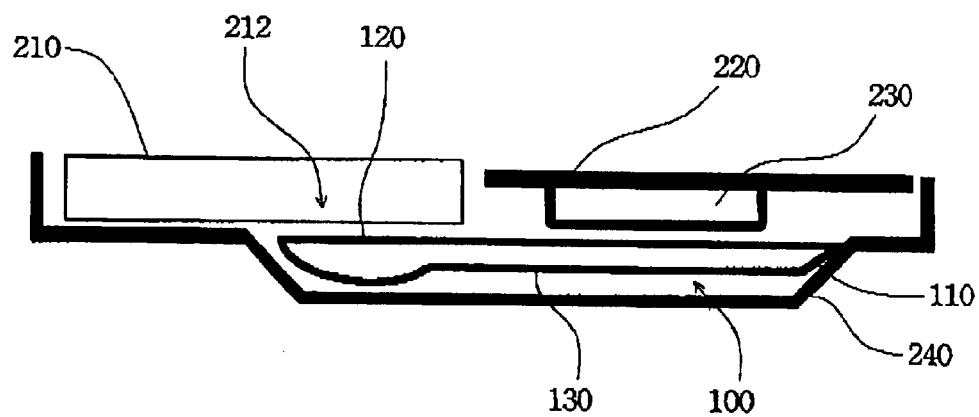
FIG. 2B is a schematic side view of FIG. 2A.

Referring to FIGS. 2A and 2B, FIG. 2A is a schematic top view of the preferred embodiment assembled in a notebook computer, and FIG. 2B is a schematic side view of FIG. 2A. As the FIGS. 2A and 2B show, the heat isolation apparatus 100 according to the present invention is configured between an integrated circuit 230 and a bottom cover 240 in a notebook computer. The integrated circuit 230, such as a central processing unit (CPU) of the notebook computer, is mounted on the printed circuit board 220. The CPU is a main heat source of the notebook computer. Due to the more complicated circuit and performance, the heat generated by the CPU increases more. When the user put the notebook computer on his or her laps, the heat passes through the bottom cover 240 and warms up the user's lap. If there is no suitable isolation, the user may feel uncomfortable, and the user may further be hurt if the temperature continually rises.

One end of the heat isolation apparatus 100, such as the inlet 110, couples with the periphery of the bottom cover 240 to suck fresh air in from outside of the notebook computer. The other end of the heat isolation apparatus 100, such as the outlet 120, couples with an inlet 212 of a fan 210 to provide the air for the fan 210. When the fan 210 is working, the suction force guides the fresh air coming from the outside of the notebook computer, entering the inlet 110, passing through the isolation wall 130, exhausting through the outlet 120, and finally entering the inlet 212 of the fan 210. By way of the air in the heat isolation apparatus 100, the heat isolation apparatus 100 according to the present invention stops the heat generated by the integrated circuit 230 mounted on the circuit board 220 of the notebook computer. Therefore, the notebook computer with the heat isolation apparatus 100 according to the present invention can prevent discomfort to the user and further avoids hurting the user by a high surface temperature of the notebook computer. Furthermore, the outlet 120 coupling with the inlet of the fan 210 has a smooth, curved shape 122 in a top view and a smooth, curved shape 124 in a cross-section view to enhance smoother transfer of air between the heat isolation apparatus 100 and the fan 210. Therefore, the noise caused by the moving air can be reduced.

The heat isolation apparatus according to the present invention is not limited to preventing heat generated by the integrated circuit, and any element generating high temperature uses a heat isolation apparatus according to the present invention as separation. The heat isolation apparatus according to the present invention can isolate the heat source if there is a high temperature heat source in any electric appliance. A person skilled in the art can modify the present invention according to the present disclosure, and such modifications and improvements do not depart from the scope and spirit of the present invention. For example, the heat isolation apparatus according to the present invention can couple the end having the smooth curve shape with the outlet of the fan and the other end with the periphery of the bottom cover. Hence, the heat isolation apparatus receives air from the fan and exhausts the air to the outside of the notebook computer.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat isolation apparatus for protecting a user from heat generated by a heat source, the heat isolation apparatus comprising:

an inlet for sucking in cool air;

an isolation wall connecting with the inlet, wherein the isolation wall has a hollow structure and the isolation wall positioned between the heat source and the user to separate the user from the heat; and an outlet connecting with the isolation wall, wherein the inlet delivers the cool air to the outlet through the hollow structure, and the inlet or the outlet has a smooth, curved shape in a top view.

2. The heat isolation apparatus of claim 1, wherein the outlet of the heat isolation apparatus further couples with an inlet of a fan and the cool air enters the inlet of the fan via the outlet of the heat isolation apparatus.

3. The heat isolation apparatus of claim 2, wherein the outlet of the heat isolation apparatus further comprises a smooth, curved shape.

4. The heat isolation apparatus of claim 1, wherein the inlet of the heat isolation apparatus further couples with an outlet of a fan and the cool air enters the inlet of the heat isolation apparatus via the outlet of the fan.

5. The heat isolation apparatus of claim 1, wherein the heat source is a central processing unit.

6. The heat isolation apparatus of claim 1, wherein the inlet comprises a smooth, curved shape in a cross-section view.

7. The heat isolation apparatus of claim 1, wherein the outlet comprises a smooth, curved shape in a cross-section view.

8. A heat isolation apparatus for separating a heat generated by a heat source from a cover of an electric appliance, the heat isolation apparatus comprising:

an inlet for sucking in cool air;

an isolation wall connecting with the inlet, wherein the isolation wall has a hollow structure and the isolation wall is positioned between the heat source and the cover of the electric appliance to separate the heat from the cover of the electric appliance;

an outlet connecting with the isolation wall, wherein the inlet delivers the cool air to the outlet by way of the isolation wall; and a fan connecting with the outlet to suck the cool air into the fan, wherein the outlet has a smooth, curved shape in a top view and a cross-section view.

9. The heat isolation apparatus of claim 8, wherein the heat source is a central processing unit.

10. The heat isolation apparatus of claim 8, wherein the inlet comprises a smooth, curved shape in a cross-section view and a top view.

11. A heat isolation apparatus for separating a heat generated by an integrated circuit from a cover of a notebook computer, the heat isolation apparatus comprising:

an inlet for sucking an external air from an outside of the notebook computer;

an isolation wall connecting with the inlet, wherein the isolation wall has a hollow structure and the isolation wall is positioned between the integrated circuit and the cover of the notebook computer to separate the heat from the cover of the notebook computer;

an outlet connecting with the isolation wall, wherein the inlet delivers external air to the outlet by way of the isolation wall; and a fan connecting with the outlet to suck the external air into the fan, wherein the outlet has a smooth, curved shape in a top view and a cross-section view.

12. The heat isolation apparatus of claim 11, wherein the inlet comprises a smooth, curved shape in a cross-section view and a top view.

* * * * *